United States Patent
Geveci

(10) Patent No.: US 10,156,626 B2
(45) Date of Patent: Dec. 18, 2018

(54) SYSTEMS AND METHODS TO SAMPLE CURRENT MEASUREMENTS IN ENERGY STORAGE DEVICES

(71) Applicant: General Electric Company, Schenectady, NY (US)

(72) Inventor: Mert Geveci, Delmar, NY (US)

(73) Assignee: General Electric Company, Schenectady, NY (US)

( * ) Notice: Subject to any disclaimer, the term of this patent is extended or adjusted under 35 U.S.C. 154(b) by 539 days.

(21) Appl. No.: 14/829,798

(22) Filed: Aug. 19, 2015

(65) Prior Publication Data

US 2017/0052242 A1 Feb. 23, 2017

(51) Int. Cl.
*G01R 35/00* (2006.01)
*G01R 19/25* (2006.01)
*G01R 31/36* (2006.01)

(52) U.S. Cl.
CPC ....... *G01R 35/005* (2013.01); *G01R 19/2509* (2013.01); *G01R 31/3613* (2013.01)

(58) Field of Classification Search
CPC .............. G01R 31/3613; G01R 35/005; G01R 19/2509
See application file for complete search history.

(56) References Cited

U.S. PATENT DOCUMENTS

| 5,485,393 A | 1/1996 | Bradford |
|---|---|---|
| 6,161,118 A | 12/2000 | Lu |
| 7,847,557 B2 | 12/2010 | Yun et al. |
| 8,823,572 B2 | 9/2014 | Lemkin |
| 2010/0090651 A1* | 4/2010 | Sahu ............. G01R 31/3624 320/132 |
| 2012/0041695 A1 | 2/2012 | Baldwin |

(Continued)

FOREIGN PATENT DOCUMENTS

| CN | 102427241 | 11/2010 |
|---|---|---|
| EP | 2233934 A1 | 9/2010 |

(Continued)

OTHER PUBLICATIONS

Muhammad K. et al., "A Low-Cost Quad-Band Single-Chip GSM/ GPRS Radio in 90nm Digital CMOS", IEEE Radio Frequency Integrated Circuits Symposium, XP031480257, pp. 197-200, Jun. 7, 2009.

(Continued)

*Primary Examiner* — Patrick Assouad
*Assistant Examiner* — Haidong Zhang
(74) *Attorney, Agent, or Firm* — Dority & Manning, P.A.

(57) ABSTRACT

Systems and methods to sample current measurements in energy storage assets while reducing bias errors such as aliasing are provided. One example current sampling system includes an integrator circuit that receives the current signal as an input and integrates the current signal to output a charge signal. The current signal is indicative of a current at an energy storage asset of an energy storage system. The current sampling system includes a charge signal sampler circuit that samples the charge signal at a charge signal sampling rate. The current sampling system includes a differentiator circuit that receives the samples of the charge signal from the charge signal sampler circuit and differentiates the samples of the charge signal to output an anti-aliased current signal.

14 Claims, 6 Drawing Sheets

(56) References Cited

U.S. PATENT DOCUMENTS

| | | | |
|---|---|---|---|
| 2013/0185007 A1* | 7/2013 | Imre | G01R 31/3679 702/63 |
| 2014/0257726 A1* | 9/2014 | Baba | G01R 31/3624 702/63 |
| 2014/0266843 A1 | 9/2014 | Pagnanelli | |

FOREIGN PATENT DOCUMENTS

| | | |
|---|---|---|
| EP | 2530481 A2 | 12/2012 |
| WO | 2014174334 A1 | 10/2014 |

OTHER PUBLICATIONS

International Search Report and Written Opinion issued in connection with corresponding PCT Application No. PCT/US2016/043035 dated Sep. 28, 2016.

* cited by examiner

SYSTEMS AND METHODS TO SAMPLE CURRENT MEASUREMENTS IN ENERGY STORAGE DEVICES

FIELD OF THE INVENTION

The present subject matter relates generally to energy storage systems and more particularly, to systems and methods to sample current measurements in energy storage assets while reducing bias errors such as aliasing.

BACKGROUND OF THE INVENTION

Tracking of state of charge in energy storage devices or energy storage assets can be a significant challenge. The most common method of state of charge estimation involves the measurement of current and its integration. However, integration of bias errors in the current measurement often results in large errors in the state of charge estimate. Aliasing errors are an example of such bias errors and are one of the most common of such errors.

Thus, performing state of charge measurements over long periods of time may become a significant challenge and, for example, may require periodic corrections which utilize the characteristics of the energy storage device. The feasibility of such corrections is highly dependent on the specific cell chemistry as well as the particular application of interest. Such corrections may also be disruptive to the operation of the storage device and are generally not desired.

In general, bias errors introduced by aliasing can be minimized using a sampling system that involves an analog anti-aliasing filter followed by sampling at the appropriate rate, for example, as guided by Nyquist rule. An example of such a scheme is shown in FIG. 1. In this approach, the sample frequency, $\omega_1$, is chosen to be significantly larger (typically, for example, five to ten times larger) than the cut-off of the anti-aliasing filter to avoid aliasing.

However, the sampling scheme illustrated in FIG. 1 requires the design and implementation of an analog filter based on assumptions of the spectral content of the input signal to be sampled as well as the sample rate implemented.

As such, changes in the assumptions or observed characteristics related to the spectral content of the sampled signal or the sample rate require corresponding changes in the analog filter. Such changes to the analog filter are often expensive and time consuming. Therefore, the sampling scheme illustrated in FIG. 1 is not easily adaptable to varying circumstances or applications.

One alternative to an application-specific anti-aliasing filter is the use of a configuration with a fixed analog anti-aliasing filter design; an appropriately high sampling rate for the given anti-aliasing filter; a digital low pass filter at this higher sample rate; and a resampling of the signal at a lower sample rate that is suitable for general computations. A block diagram for such a scheme is shown in FIG. 2. In this scheme, the sample frequency, $\omega_1$, is selected based on the design of the analog anti-aliasing filter, while the sample frequency, $\omega_2$, is the desired sampling frequency for the control system.

However, the scheme illustrated in FIG. 2 is often implemented in applications where one set of control and measurement hardware is utilized for multiple applications. Thus, it is not feasible to reconfigure the hardware (e.g., fixed filters) of the system for each different application.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a current sampling system to de-alias a current signal. The current sampling system includes an integrator circuit that receives the current signal as an input and integrates the current signal to output a charge signal. The current signal is indicative of a current at an energy storage asset of an energy storage system. The current sampling system includes a charge signal sampler circuit that samples the charge signal at a charge signal sampling rate. The current sampling system includes a differentiator circuit that receives the samples of the charge signal from the charge signal sampler circuit and differentiates the samples of the charge signal to output an anti-aliased current signal.

Another example aspect of the present disclosure is directed to an energy storage system. The energy storage system includes at least one energy storage asset. The energy storage system includes a state of charge determination system to determine a state of charge of the at least one energy storage asset based at least in part on a current signal indicative of a current at the at least one energy storage asset. The state of charge determination system includes a current sampling system that de-aliases the current signal. The current sampling system includes an integrator that receives the current signal as an input and integrates the current signal to output a charge signal. The current sampling system includes a charge signal sampler that samples the charge signal at a charge signal sampling rate. The current sampling system includes a differentiator that receives the samples of the charge signal from the charge signal sampler and differentiates the samples of the charge signal to output an anti-aliased current signal. The state of charge determination system further includes a current sample integrator that re-integrates the anti-aliased current signal to generate asset state of charge data that is indicative of the state of charge of the at least one energy storage asset.

Another example aspect of the present disclosure is directed to a method to de-alias a first signal. The method includes integrating, by an integrator circuit, the first signal to obtain a second signal that is indicative of an integral of the first signal. The method includes sampling, by a sampler circuit, the second signal at a sampling rate to obtain a set of samples of the second signal. The method includes differentiating, by a differentiator circuit, the set of samples of the second signal to obtain an anti-aliased version of the first signal.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Figure 1:
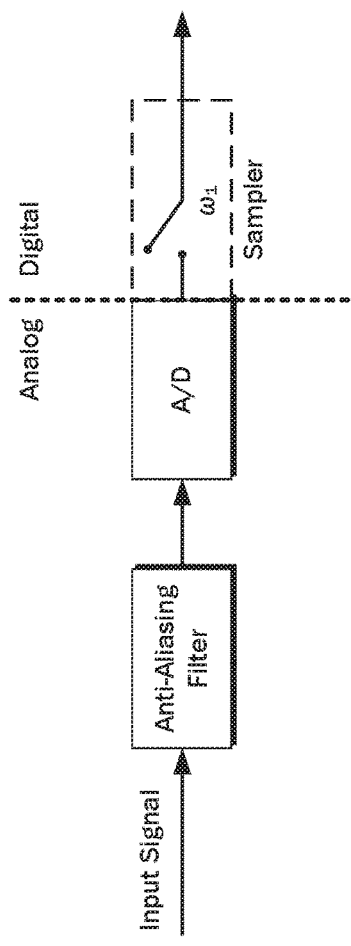
FIG. 1 depicts a current sampling scheme.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to systems and methods that sample current measurements in energy storage assets such as batteries. In particular, the present disclosure provides current sampling systems that eliminate the impact of bias errors, such as aliasing, on the resulting current samples.

According to one aspect of the present disclosure, a novel current sampling system includes an integrator circuit. The integrator circuit may prevent the need for an additional digital anti-aliasing filter as described with reference to FIG. 2. The integrator circuit can integrate a current signal that is indicative of a current measured at an energy storage asset. The integrator can integrate the current signal either by analog methods or through digital methods performed, for example, at a relatively high sampling rate. After integration, the current signal can be sampled at a relatively lower sampling rate. Such approach provided of the present disclosure reduces aliasing-related errors without the burden of carrying out computationally expensive calculations at a high sample rate.

As one example, the current signal can be integrated to obtain a charge signal that is indicative of a change in the current signal over time. A sampling circuit can sample the charge signal at a desired frequency (e.g., the sampling frequency of the control system). A differentiator circuit can then differentiate the samples of the charge signal to obtain an anti-aliased current signal.

One advantage provided by aspects of the present disclosure is that bias errors in the main signal of interest (e.g., state of charge) are eliminated. In particular, since the sampled signal represents charge rather than its derivative (current), the sampled signal is not aliased. Another advantage provided by aspects of the present disclosure is that application specific filter designs are not required.

Figure 2:
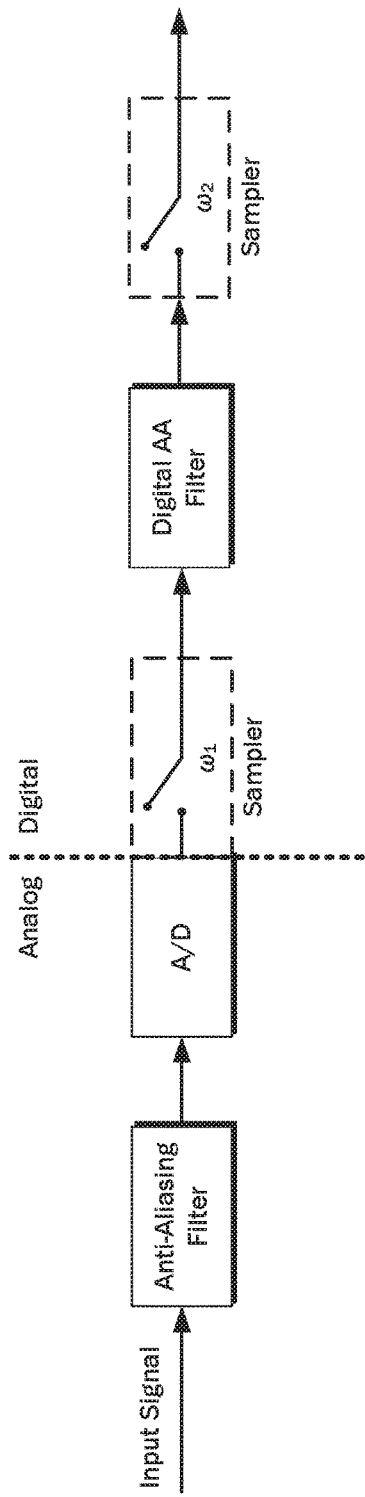
FIG. 2 depicts a current sampling scheme.

Thus, relative to the schemes illustrated in FIGS. 1 and 2, aspects of the present disclosure have the advantages of reducing the filtering of the higher frequency content of the signal while providing a relatively lower computational burden. Further, the present disclosure can easily be implemented with respect to various applications or signals having varying spectral content without requiring corresponding changes in the design and implementation of fixed hardware such as filters.

With reference now to the Figures, example embodiments of the present disclosure will now be discussed in detail.

Figure 3:
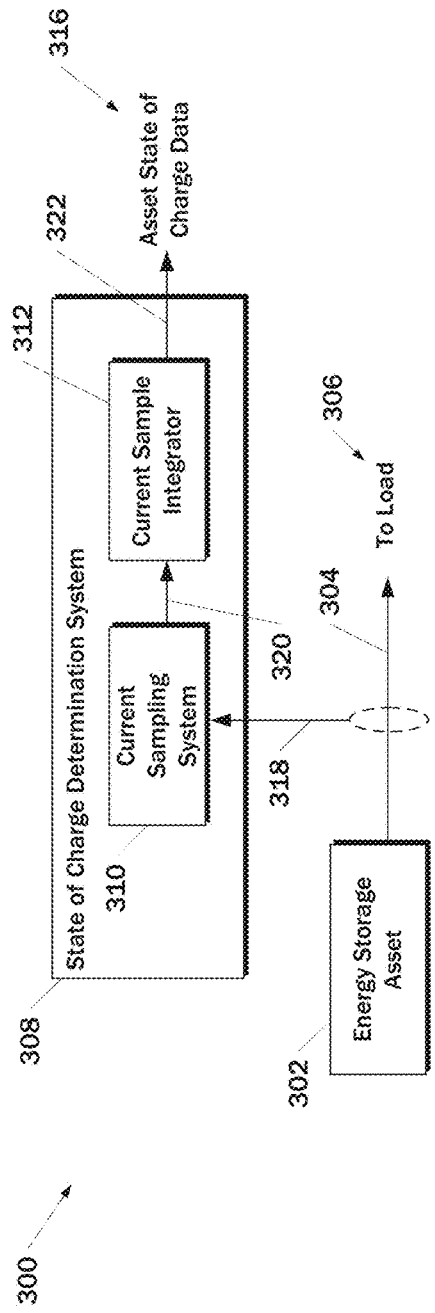
FIG. 3 depicts an example energy storage system according to example embodiments of the present disclosure.

FIG. 3 depicts an example energy storage system 300 according to example embodiments of the present disclosure. The energy storage system 300 includes an energy storage asset 302 and a state of charge determination system 308.

The energy storage asset 302 can be any asset, device, component, or system that stores energy. For example, the energy storage asset 302 can be a battery and/or any related components (e.g., inverter, converter, etc.) that assist a battery in interfacing with a load 306 such as an energy grid. In particular, the energy storage asset 302 can provide or supply a current 304 to the load 306. In some implementations, the energy storage asset 302 can also receive current 304 from the load 306. For example, the energy storage asset 302 may be charged (e.g., increase state of charge) by receiving current from a load 306 such as, for example, an energy grid.

As one example, the energy storage asset 302 can include a battery energy storage system (BESS). The BESS can include one or more battery energy storage devices, such battery cells or battery packs. The battery energy storage devices can contain one or more sodium nickel chloride batteries, sodium sulfur batteries, lithium ion batteries, nickel metal hydride batteries, or other similar devices. The present disclosure is discussed with reference to a battery energy storage system for purposes of illustration and discussion, those of ordinary skill in the art, using the disclosures provided herein, should understand that other energy storage devices (e.g., capacitors, fuel cells, etc.) can be used without deviating from the scope of the present disclosure.

The state of charge determination system 308 can generate or assist in generating asset state of charge data 316 that describes a state of charge of the energy storage asset 302. The state of charge determination system 308 includes a current sampling system 310 and a current sample integrator 312.

The current sampling system 310 can sample the current 304 between the energy storage asset 302 and the load 306. In particular, according to aspects of the present disclosure, the current sampling system 310 can generate an anti-aliased current signal 320 based on an input current signal 318. The input current signal 318 can describe the current 304 between the energy storage asset 302 and the load 306. For example, the current signal 318 can be measurements of the current 304 obtained through the use of various components such as, for example, a current transformer. Example implementations of the current sampling system 310 according to aspects of the present disclosure will be discussed further with respect to FIGS. 4 and 6.

The current sample integrator 312 can integrate the anti-aliased current signal 320 to generate or assist in generating the asset state of charge data 316 according to various techniques including, for example, "coulomb counting." As one example, the current sample integrator 312 can output an anti-aliased charge signal 322.

Furthermore, in some implementations of the present disclosure, the anti-aliased current signal 320 and/or the anti-aliased charge signal 322 can be provided to various other components of a control system of the energy storage system 300. For example, such other components may use samples of the signals 320 and/or 322 for any other purposes for which knowledge of current, charge, or state of charge of the asset 302 is useful.

Figure 4:
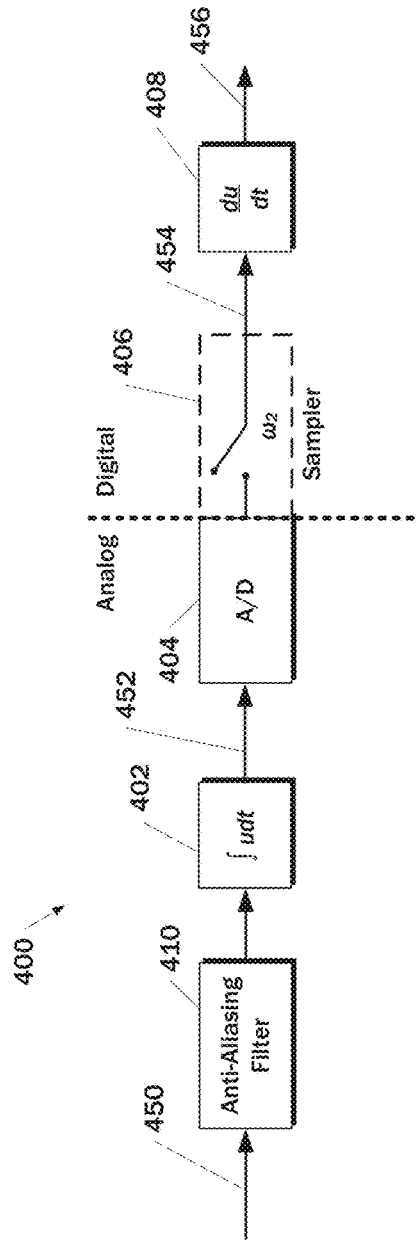
FIG. 4 depicts an example current sampling system according to example embodiments of the present disclosure.

FIG. 4 depicts an example current sampling system 400 according to example embodiments of the present disclosure. The current sampling system 400 includes an analog integrator circuit 402, an analog to digital converter circuit 404, a charge signal sampler circuit 406 and a digital differentiator circuit 408.

As used herein, the term "circuit" includes any combination of one or more electrical and/or computing components that are arranged or configured to perform or implement a particular task, function, and/or computing logic. As one example, a circuit can include one or more electrical components (e.g., resistors, capacitors, semiconductor devices, etc.) connected in a particular arrangement and designed to behave in a certain fashion. As another example, a circuit can include a processor device (e.g., a processor, microprocessor, ASIC, FPGA, controller, microcontroller, etc.). The processor device can implement a set of computer-readable instructions to perform or implement a particular task, function, and/or computing logic. The set of instructions can be stored on a non-transitory computer-readable medium (e.g., RAM, ROM, hard drives, flash drives, other memory devices, etc.) that may be included in the circuit. For example, in some implementations of the present disclosure, the digital differentiator circuit 408 includes instructions implemented by a digital processor device.

According to an aspect of the present disclosure, the current sampling system 400 can receive an analog version of a current signal 450 as an input and provide a digital anti-aliased current signal 456 as an output. More particularly, the analog version of the current signal 450 can describe a current between an energy storage asset and a load. For example, the analog version of the current signal 450 can be real-time measurements of such current. The system 400 can optionally include an analog anti-aliasing filter 410 which initially filters the analog version of the current signal 450. The analog version of the current signal 450 is then received by the analog integrator circuit 402 and integrated to obtain an analog version of a charge signal 452. The analog version of the charge signal 452 is indicative of an integral of the analog version of the current signal 450.

Next, the analog to digital converter circuit 404 converts the analog version of the charge signal 452 to a digital version of the charge signal. The charge signal sampler circuit 406 samples the digital version of the charge signal at a charge signal sampling rate $\omega_2$ to obtain a set of samples 454 of the digital version of the charge signal. The charge signal sampling rate $\omega_2$ can be a rate that is suitable for various control system operations or objectives.

The digital differentiator circuit 408 differentiates the set of samples 454 of the digital version of the charge signal to obtain and output the digital anti-aliased current signal 456. The digital differentiator circuit 408 can be a discrete differentiator circuit that performs discrete differentiation.

In some implementations, the digital version of the charge signal or the set of samples thereof may be directly used by the control system or other components of the corresponding energy storage system.

Figure 5:
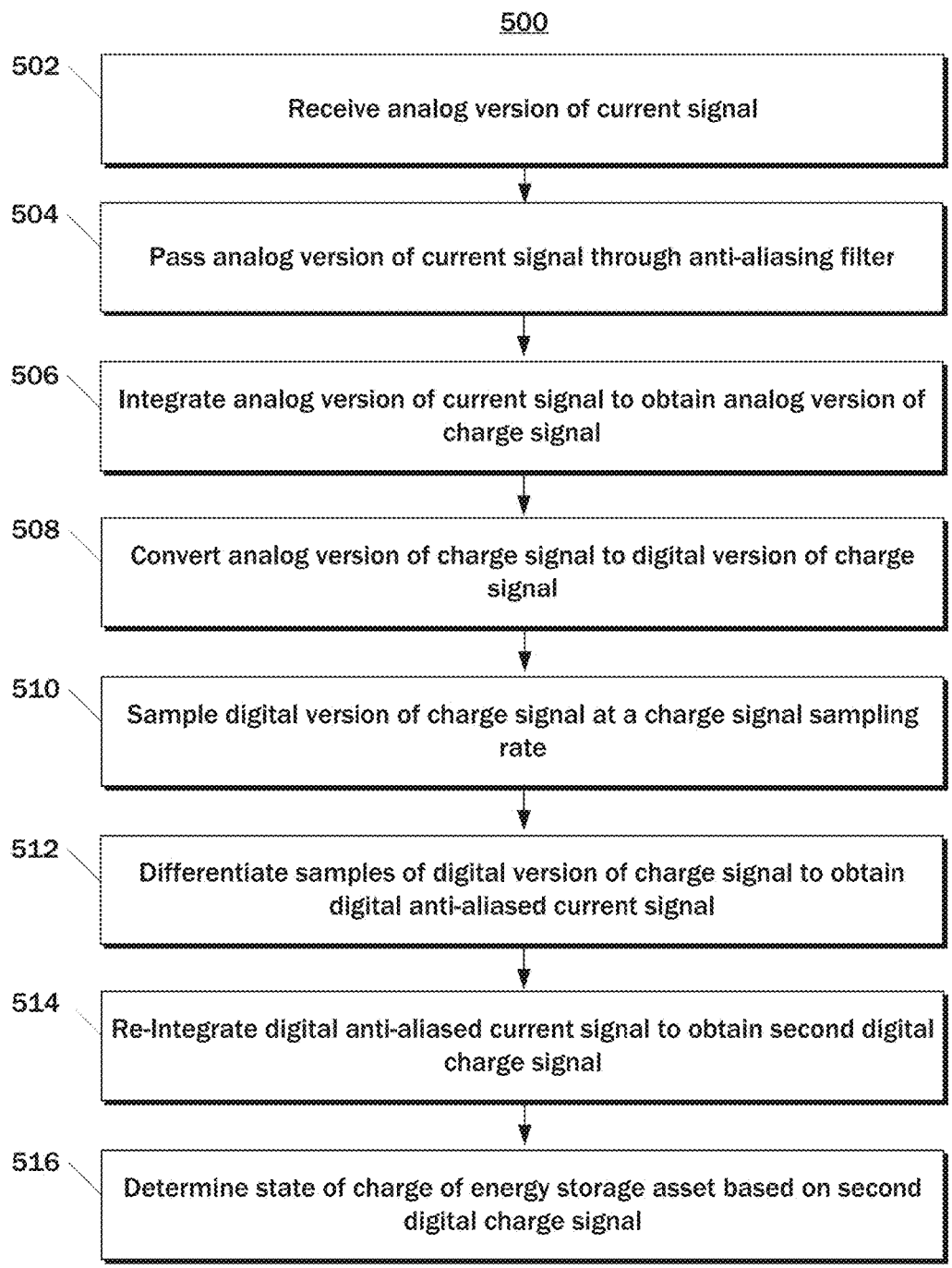
FIG. 5 depicts an example method for sampling a current at an energy storage device according to example embodiments of the present disclosure.

FIG. 5 depicts a flow diagram of an example method 500 for according to example embodiments of the present disclosure. Although method 500 will be discussed with reference to the current sampling system 400 of FIG. 4, the method 500 can be implemented by any suitable current sampling system.

In addition, FIG. 5 depicts steps performed in a particular order for purposes of illustration and discussion. The steps of any of the methods disclosed herein can be modified, adapted, rearranged, omitted, and/or expanded in various ways without deviating from the scope of the present disclosure.

At 502, an analog version of a current signal is received. The current signal can be indicative of a current at an energy storage asset, such as, for example, a battery. For example, the received current signal may consist of measurements of a current from the energy storage asset to a load. As one example, the analog version of the current signal 450 can be received at the analog anti-aliasing filter 410.

At 504, the analog version of the current signal is passed through an anti-aliasing filter. As one example, the analog version of the current signal 450 can be passed through the analog anti-aliasing filter 410. In some implementations, method 500 does not include block 504 and, at 502, the analog version of the current signal is directly received at an analog integrator circuit.

At 506, the analog version of the current signal is integrated to obtain an analog version of a charge signal. As one example, the analog integrator circuit 402 can integrate the analog version of the current signal 450 to obtain and output the analog version of the charge signal 452.

At 508, the analog version of the charge signal is converted to a digital version of the charge signal. As one example, the analog to digital converter circuit 404 can convert the analog version of the charge signal 452 into the digital version of the charge signal.

At 510, the digital version of the charge signal is sampled at a charge signal sampling rate. As one example, the charge signal sampler circuit 406 can sample the digital version of the charge signal at the charge signal sampling rate $\omega_2$ to obtain a set of samples 454 of the digital version of the charge signal. The charge signal sampling rate $\omega_2$ can be a rate that is suitable for various control system operations or objectives.

At 512, the samples of the digital version of the charge signal are differentiated to obtain a digital anti-aliased current signal. As one example, the digital differentiator circuit 408 can differentiate the set of samples 454 of the digital version of the charge signal to obtain and output the digital anti-aliased current signal 456.

At 514, the digital anti-aliased current signal is re-integrated to obtain a second digital charge signal. For example, with reference to FIG. 3, the current sample integrator 312 can re-integrate the anti-aliased current signal 320 to obtain a second digital charge signal 322.

At 516, a state of charge of the energy storage asset is determined based on the second digital charge signal. For example, with reference to FIG. 3, various techniques can be performed to compute or otherwise estimate state of charge data 316 for the energy storage asset 302 based on the second digital charge signal 322 output by the current sample integrator 312.

Figure 6:
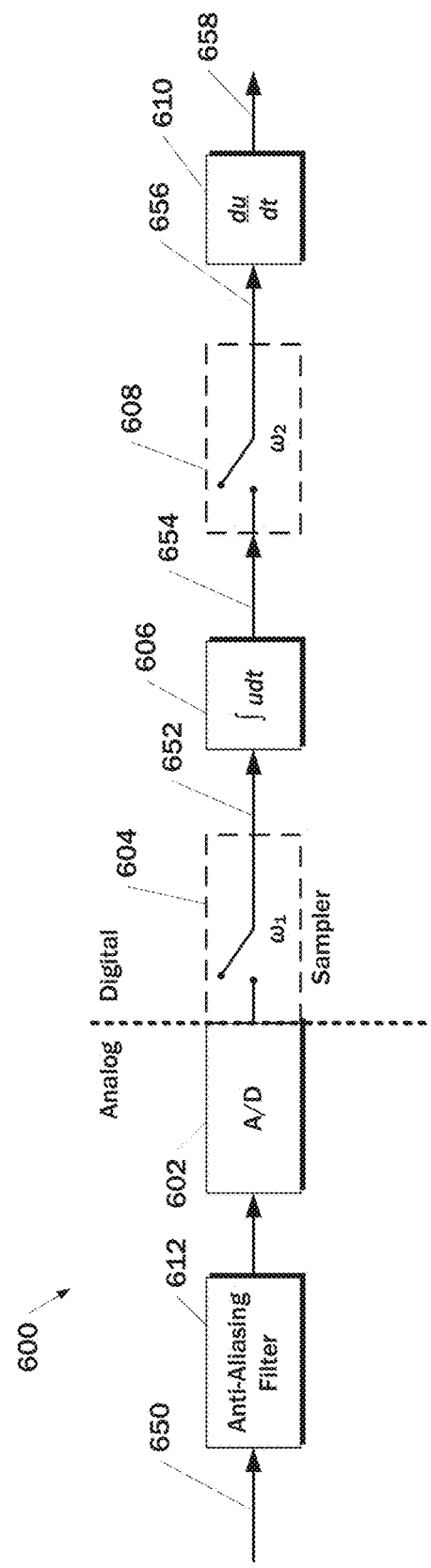
FIG. 6 depicts an example current sampling system according to example embodiments of the present disclosure.

FIG. 6 depicts an example current sampling system 600 according to example embodiments of the present disclosure. In some implementations, the current sampling system 600 utilizes a digital integration of the current signal at a high sample rate and resampling at the sample rate of the control system followed by discrete differentiation.

In particular, the current sampling system 600 includes an analog to digital converter circuit 602, a current signal sampler circuit 604, a digital integrator circuit 606, a charge signal sampler circuit 608 and a digital differentiator circuit 610. The current sampling system 600 can receive an analog version of a current signal 650 as an input and provide a digital anti-aliased current signal 658 as an output.

More particularly, the analog version of the current signal 650 can describe a current between an energy storage asset and a load. For example, the analog version of the current signal 650 can be real-time measurements of such current. The system 600 can optionally include an analog anti-aliasing filter 612 which initially filters the analog version of the current signal 650. The analog version of the current signal 650 is then received by the analog to digital converter circuit 602.

The analog to digital converter circuit 602 converts the analog version of the current signal 650 to a digital version of the current signal. The current signal sampler circuit 604 samples the digital version of the current signal at a current signal sampling rate $\omega_1$ to obtain a set of samples 652 of the digital version of the current signal. In some implementations, the current signal sampling rate $\omega_1$ is greater (e.g., significantly greater) than the charge signal sampling rate $\omega_2$.

The digital integrator circuit 606 integrates the set of samples 652 of the digital version of the current signal to obtain and output a digital version of a charge signal 654. The charge signal sampler circuit 608 samples the digital version of the charge signal 654 at a charge signal sampling rate $\omega_2$ to obtain a second set of samples 656 of the digital version of the charge signal 654. The charge signal sampling rate $\omega_2$ can be a rate that is suitable for various control system operations or objectives.

The digital differentiator circuit 610 differentiates the second set of samples 656 of the digital version of the charge signal 654 to obtain and output the digital anti-aliased current signal 658. The digital differentiator circuit 610 can be a discrete differentiator circuit that performs discrete differentiation.

In some implementations, the digital version of the charge signal 654 or the set of samples thereof 656 may be directly used by the control system or other components of the corresponding energy storage system.

Figure 7:
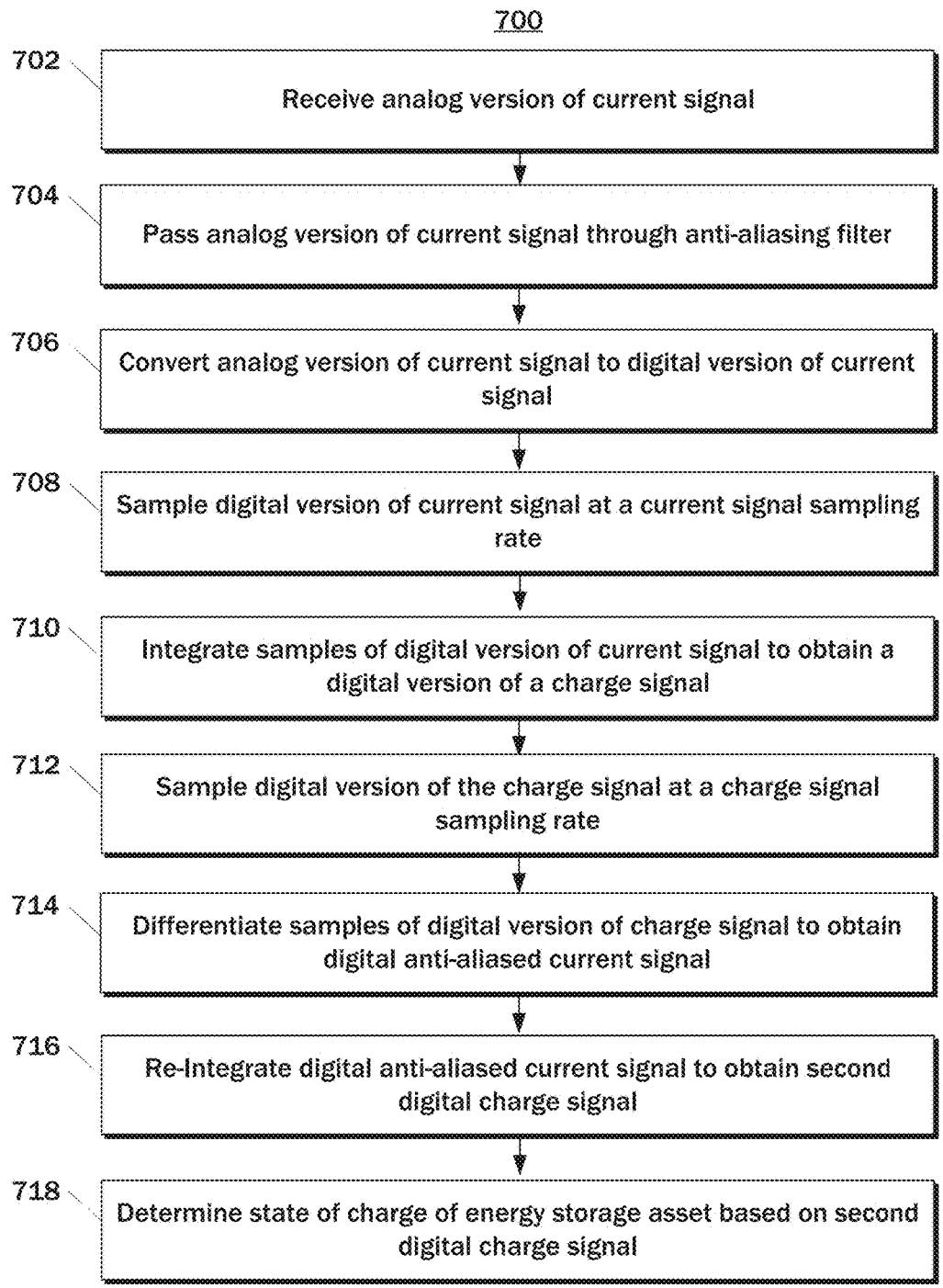
FIG. 7 depicts an example method for sampling a current at an energy storage device according to example embodiments of the present disclosure.

FIG. 7 depicts a flow diagram of an example method 700 for according to example embodiments of the present disclosure. Although method 700 will be discussed with reference to the current sampling system 600 of FIG. 6, the method 700 can be implemented by any suitable current sampling system.

In addition, FIG. 7 depicts steps performed in a particular order for purposes of illustration and discussion. The steps of any of the methods disclosed herein can be modified, adapted, rearranged, omitted, and/or expanded in various ways without deviating from the scope of the present disclosure.

At 702, an analog version of a current signal is received. The current signal can be indicative of a current at an energy storage asset, such as, for example, a battery. For example, the received current signal may consist of measurements of a current from the energy storage asset to a load. As one example, the analog version of the current signal 650 can be received at the analog anti-aliasing filter 612.

At 704, the analog version of the current signal is passed through an anti-aliasing filter. As one example, the analog anti-aliasing filter 612 can initially filter the analog version of the current signal 650.

At 706, the analog version of the current signal is converted into a digital version of the current signal. As one example, the analog to digital converter circuit 602 can convert the analog version of the current signal 650 to a digital version of the current signal.

At 708, the digital version of the current signal is sampled at a current signal sampling rate. As one example, the current signal sampler circuit 604 can sample the digital version of the current signal at a current signal sampling rate $\omega_1$ to obtain a set of samples 652 of the digital version of the current signal. In some implementations, the current signal sampling rate $\omega_1$ is greater (e.g., significantly greater) than the charge signal sampling rate $\omega_2$.

At 710, the samples of the digital version of the current signal are integrated to obtain a digital version of a charge signal. As one example, the digital integrator circuit 606 can integrate the set of samples 652 of the digital version of the current signal to obtain and output a digital version of a charge signal 654.

At 712, the digital version of the charge signal is sampled at a charge signal sampling rate. As one example, the charge signal sampler circuit 608 can sample the digital version of the charge signal 654 at a charge signal sampling rate $\omega_2$ to obtain a second set of samples 656 of the digital version of the charge signal 654. The charge signal sampling rate $\omega_2$ can be a rate that is suitable for various control system operations or objectives.

At 714, the samples of the digital version of the charge signal are differentiated to obtain a digital anti-aliased current signal. As one example, the digital differentiator circuit 610 can differentiate the second set of samples 656 of the digital version of the charge signal 654 to obtain and output the digital anti-aliased current signal 658. The digital differentiator circuit 610 can be a discrete differentiator circuit that performs discrete differentiation.

At 716, the digital anti-aliased current signal is re-integrated to obtain a second digital charge signal. As one example, with reference to FIG. 3, the current sample integrator 312 can re-integrate the anti-aliased current signal 320 to obtain a second digital charge signal 322.

At 718, a state of charge of the energy storage asset is determined based on the second digital charge signal. As one example, with reference to FIG. 3, various techniques can be performed to compute or otherwise estimate state of charge data 316 for the energy storage asset 302 based on the second digital charge signal 322 output by the current sample integrator 312.

Figure 8:
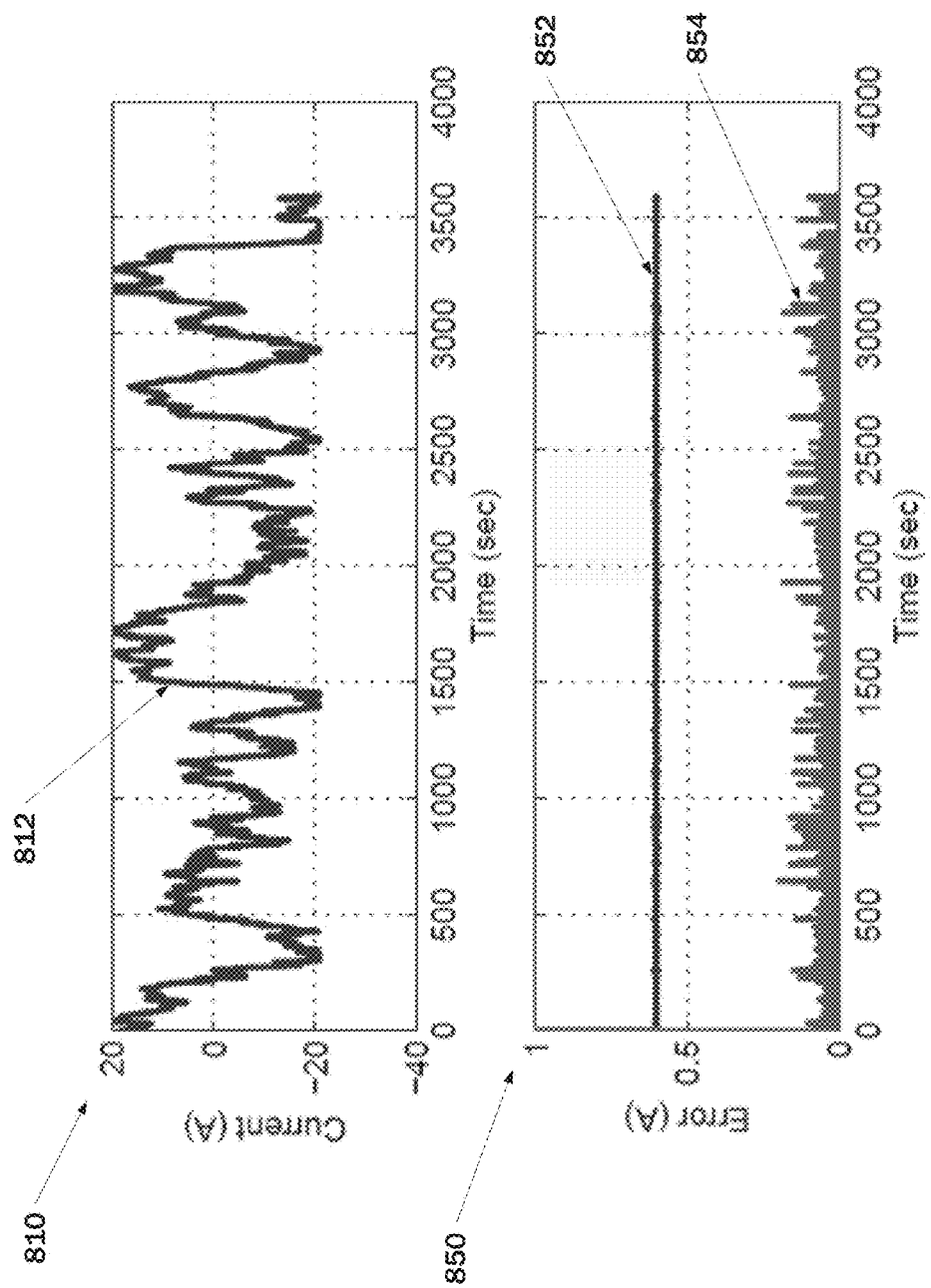
FIG. 8 depicts a pair of graphs illustrating an example comparison of the results of the systems and methods of the present disclosure against a baseline sampling scheme.

FIG. 8 depicts a pair of graphs 810 and 850 that illustrate a comparison of example results of the systems and methods of the present disclosure against example results of a baseline sampling scheme. In particular, graph 810 includes a plot 812 of a current signal over time. Graph 850 includes two plots 852 and 854 which respectively show sampling errors respectively associated with a baseline sampling scheme (plot 852) and the sampling schemes of the present disclosure (plot 854).

More particularly, in the particular example for which results are illustrated, a current measurement noise in the form of a sine wave at a frequency of 50 Hz and amplitude 1 Amp was simulated. In both cases, a third order Bessel (low-pass) filter with a cutoff frequency of 180 Hz was utilized for anti-aliasing purposes. The proposed sampling schemes according to aspects of the present disclosure reduced the RMS error in the measurement by a factor of six, as illustrated by the results of this particular example.

Thus, the systems and methods according to aspects of the present disclosure offer the ability to make an unaliased charge measurement available to all processes within the control system. Therefore, spectrally consistent measurements of the charge and current signals can be made at different sample rates without additional considerations for the design of additional aliasing filters. Such a concept may not be applicable to all signals since the integration process in some cases may result in an unbounded signal. However, in the case of an energy storage device or asset, the output of the integrator circuits can be bounded since the capacity of such energy storage device or asset is finite.

Further, although the systems and method of the present disclosure are particularly advantageous for the case of sampling a current signal of an energy storage asset in an energy storage system, aspects of the present disclosure are easily and beneficially applicable to any scenario in which anti-aliasing of a signal is desired and, in particular, to scenarios in which an integral of a particular signal is useful but suffers from bias errors such as aliasing.

Although specific features of various embodiments may be shown in some drawings and not in others, this is for convenience only. In accordance with the principles of the present disclosure, any feature of a drawing may be referenced and/or claimed in combination with any feature of any other drawing. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A current sampling system to de-alias a current signal, comprising:
    an analog to digital converter circuit that converts an analog version of the current signal into a digital version of the current signal, wherein the current signal is indicative of a current at an energy storage asset of an energy storage system;
    a current signal sampler circuit that samples the digital version of the current signal at a current signal sampling rate;
    a digital integrator circuit that receives the samples of the digital version of the current signal from the current signal sampler circuit as an input and integrates the digital version of the current signal to output a digital version of a charge signal;
    a charge signal sampler circuit that samples the charge signal at a charge signal sampling rate; and
    a differentiator circuit that receives the samples of the charge signal from the charge signal sampler circuit and differentiates the samples of the charge signal to output an anti-aliased current signal.

2. The current sampling system of claim 1, wherein:
    the charge signal sampler circuit samples the digital version of the charge signal output by the digital integrator circuit; and
    the differentiator circuit comprises a digital differentiator circuit that receives the samples of the digital version of the charge signal from the charge signal sampler circuit, digitally differentiates the digital version of the charge signal, and outputs a digital anti-aliased current signal.

3. The current sampling system of claim 1, wherein the current signal sampling rate is greater than the charge signal sampling rate.

4. The current sampling system of claim 1, wherein the digital differentiator circuit comprises a discrete differentiator circuit.

5. The current sampling system of claim 1, wherein the charge signal sampling rate comprises a control system sampling rate.

6. The current sampling system of claim 1, further comprising:
    a second integrator circuit that receives the anti-aliased current signal as an input and integrates the anti-aliased current signal to output a second charge signal, wherein the second charge signal is useful to determine a state of charge of the energy storage asset.

7. The current sampling system of claim 1, further comprising:
    an anti-aliasing filter positioned upstream relative to the analog to digital converter circuit.

8. A method to de-alias a first signal, the method comprising:
    integrating, by an analog integrator circuit, an analog version of the first signal to obtain an analog version of a second signal that is indicative of an integral of the analog version of the first signal;
    converting, by an analog to digital conversion circuit, the analog version of the second signal to a digital version of the second signal;
    sampling, by a sampler circuit, the digital version of the second signal at a sampling rate to obtain a set of samples of the digital version of the second signal; and
    differentiating, by a digital differentiator circuit, the set of samples of the digital version of the second signal to obtain a digital anti-aliased version of the first signal.

9. The method of claim 8, further comprising:
    integrating, by a second integrator circuit, the digital anti-aliased version of the first signal.

10. A current sampling system to de-alias a current signal, comprising:
    an analog integrator circuit that receives an analog version of the current signal as an input and integrates the analog version of the current signal to output an analog version of a charge signal, wherein the current signal is indicative of a current at an energy storage asset of an energy storage system;
    an analog to digital converter circuit that converts the analog version of the charge signal to a digital version of the charge signal;
    a digital charge signal sampler circuit that samples the digital version of the charge signal at a charge signal sampling rate; and
    a digital differentiator circuit that receives the samples of the digital version of the charge signal from the digital charge signal sampler circuit and differentiates the samples of the digital version of the charge signal to output a digital anti-aliased current signal.

11. The current sampling system of claim 10, wherein the digital differentiator circuit comprises a discrete differentiator circuit.

12. The current sampling system of claim 10, wherein the charge signal sampling rate comprises a control system sampling rate.

13. The current sampling system of claim 10, further comprising:
    a second integrator circuit that receives the digital anti-aliased current signal as an input and integrates the digital anti-aliased current signal to output a second charge signal, wherein the second charge signal is useful to determine a state of charge of the energy storage asset.

14. The current sampling system of claim 10, further comprising:
an anti-aliasing filter positioned upstream relative to the analog integrator circuit.

* * * * *